(12) United States Patent
Bauer

(10) Patent No.: US 7,648,853 B2
(45) Date of Patent: Jan. 19, 2010

(54) DUAL CHANNEL HETEROSTRUCTURE

(75) Inventor: Matthias Bauer, Phoenix, AZ (US)

(73) Assignee: ASM America, Inc., Phoenix, AZ (US)

( * ) Notice: Subject to any disclaimer, the term of this patent is extended or adjusted under 35 U.S.C. 154(b) by 247 days.

(21) Appl. No.: 11/485,047

(22) Filed: Jul. 11, 2006

(65) Prior Publication Data

US 2008/0014721 A1   Jan. 17, 2008

(51) Int. Cl.
*H01L 21/00* (2006.01)
*H01L 21/338* (2006.01)
*H01L 21/8238* (2006.01)
*H01L 21/46* (2006.01)
*H01L 21/461* (2006.01)

(52) U.S. Cl. .................. 438/87; 438/167; 438/172; 438/222; 438/226; 438/455; 438/489; 438/752; 438/753; 438/758; 257/E21.102; 257/E21.371; 257/E21.403

(58) Field of Classification Search .......... 257/E21.102, 257/E21.371, E21.403
See application file for complete search history.

(56) References Cited

U.S. PATENT DOCUMENTS

| | | | |
|---|---|---|---|
| 5,221,556 A | 6/1993 | Hawkins et al. | |
| 5,256,550 A | 10/1993 | Laderman et al. | |
| 5,259,918 A | 11/1993 | Akbar et al. | |
| 5,442,205 A * | 8/1995 | Brasen et al. | 257/191 |
| 5,759,989 A * | 6/1998 | Scialla et al. | 510/500 |
| 5,879,970 A | 3/1999 | Shiota et al. | |
| 5,891,769 A | 4/1999 | Liaw et al. | |
| 6,030,894 A | 2/2000 | Hada et al. | |
| 6,059,895 A * | 5/2000 | Chu et al. | 148/33.1 |
| 6,093,252 A | 7/2000 | Wengert et al. | |
| 6,319,782 B1 | 11/2001 | Nakabayashi | |
| 6,373,112 B1 | 4/2002 | Murthy et al. | |
| 6,537,370 B1 | 3/2003 | Hernandez et al. | |
| 6,562,736 B2 | 5/2003 | Yanagawa et al. | |
| 6,573,126 B2 | 6/2003 | Cheng et al. | |
| 6,592,942 B1 | 7/2003 | Van Wijck | |

(Continued)

FOREIGN PATENT DOCUMENTS

EP   0 858 101 A2   2/1998

(Continued)

OTHER PUBLICATIONS

Bauer et al., "Relaxed SiGe Buffers with Thicknesses below 0.1 μm," *Thin Solid Films* 369:152-156 (2000).

(Continued)

*Primary Examiner*—Charles D Garber
*Assistant Examiner*—Mohsen Ahmadi
(74) *Attorney, Agent, or Firm*—Knobbe, Martens, Olson & Bear LLP

(57) ABSTRACT

Dual channel heterostructures comprising strained Si and strained Ge-containing layers are disclosed, along with methods for producing such structures. In preferred embodiments, a strain-relaxed buffer layer is deposited on a carrier substrate, a strained Si layer is deposited over the strain-relaxed buffer layer and a strained Ge-containing layer is deposited over the strained Si layer. The structure can be transferred to a host substrate to produce the strained Si layer over the strained Ge-containing layer. By depositing the Si layer first, the process avoids Ge agglomeration problems.

21 Claims, 6 Drawing Sheets

U.S. PATENT DOCUMENTS

| | | | |
|---|---|---|---|
| 6,633,066 B1 | 10/2003 | Bae et al. | |
| 6,645,836 B2 | 11/2003 | Kanzawa et al. | |
| 6,713,326 B2 | 3/2004 | Cheng et al. | |
| 7,238,595 B2 | 11/2004 | Brabant et al. | |
| 6,844,213 B2 | 1/2005 | Sparks | |
| 6,858,502 B2 | 2/2005 | Chu et al. | |
| 6,875,279 B2 | 4/2005 | Chu et al. | |
| 6,900,115 B2 | 5/2005 | Todd | |
| 6,958,253 B2 | 10/2005 | Todd | |
| 7,115,521 B2 | 1/2006 | Brabant et al. | |
| 7,037,856 B1 | 5/2006 | Mae et al. | |
| 7,071,014 B2 * | 7/2006 | Currie et al. | 438/26 |
| 7,141,820 B2 * | 11/2006 | Lee et al. | 257/65 |
| 7,217,949 B2 * | 5/2007 | Chan et al. | 257/19 |
| 7,229,901 B2 * | 6/2007 | Savage et al. | 438/479 |
| 7,375,385 B2 * | 5/2008 | Westhoff et al. | 257/191 |
| 7,465,619 B2 * | 12/2008 | Fitzgerald | 438/199 |
| 7,531,393 B2 * | 5/2009 | Doyle et al. | 438/151 |
| 7,541,208 B2 * | 6/2009 | Currie et al. | 438/46 |
| 2002/0173130 A1 | 11/2002 | Pomerede et al. | |
| 2003/0045063 A1 | 3/2003 | Oda | |
| 2003/0082300 A1 | 5/2003 | Todd et al. | |
| 2003/0124818 A1 | 7/2003 | Luo et al. | |
| 2003/0157787 A1 | 8/2003 | Murthy et al. | |
| 2003/0190791 A1 | 10/2003 | Fischetti et al. | |
| 2003/0207127 A1 | 11/2003 | Murthy et al. | |
| 2003/0215990 A1 * | 11/2003 | Fitzgerald et al. | 438/172 |
| 2003/0235931 A1 | 12/2003 | Wada et al. | |
| 2004/0217845 A1 | 11/2004 | Silver et al. | |
| 2005/0079692 A1 | 4/2005 | Samoilov et al. | |
| 2005/0191826 A1 | 9/2005 | Bauer et al. | |
| 2005/0279992 A1 * | 12/2005 | Gupta et al. | 257/24 |
| 2006/0216417 A1 | 9/2006 | Todd et al. | |
| 2008/0142842 A1 * | 6/2008 | Lin et al. | 257/190 |

FOREIGN PATENT DOCUMENTS

| | | |
|---|---|---|
| WO | WO 00/15885 | 3/2000 |
| WO | WO 01/41544 | 6/2001 |

OTHER PUBLICATIONS

Bauer et al., "High Ge content photodetectors on thin SiGe buffers," *Materials Science and Engineering* B89:77-83 (2002).

Bensahel et al., "Single-wafer processing of in-situ doped polycrystalline Si and $Si_{1-x}Ge_x$," *Solid State Technology*, pp. S5-S10 (Mar. 1998).

Cannon et al., "Tensile strained epitaxial Ge films on Si(100) substrates with potential application in L-band telecommunications," *Applied Physics Letters* 84(6): 906-908 (2004).

Cheng et al., "Hole Mobility Enhancement in Strained-Si/strained-SiGe Heterostructure p-MOSFETs Fabricated on SiGe-on-insulator (SGOI)," *Semicond. Sci. Technol.* 19: L48-L51 (2004).

Chui et al., "Ultrathin High-*k* Gate Dielectric Technology for Germanium MOS Applications," *IEEE 60th Annual Device Research Conference (DRC) Digest*, paper VII.B2, pp. 191-192 (2002).

Colace et al., "Ge/Si(001) photodetector for near infrared light," *Solid State Phenomena* 54:55-58 (1997).

Colace et al., "Metal-semiconductor-metal near-infrared light detector based on epitaxial Ge/Si," *Applied Physics Letters* 72:3175-3177 (1998).

Colace et al., "Metal-Ge-Si diodes for near-infrared light detection," *Journal of Vacuum Science and Technology B* 17:465 (1999).

Colace et al., "Efficient high-speed near-infrared Ge photodetectors integrated on Si substrates," *Applied Physics Letters* 76(10): 1231-1233 (2000).

Colace et al., "Ge-on-Si Approaches to the Detection of Near-Infrared Light," *IEEE Journal of Quantum Electronics* 35(12): 1843-1852 (1999).

Currie et al., "Controlling threading dislocation densities in Ge on Si using graded SiGe layers and chemical-mechanical polishing," *Applied Physics Letters* 72:1718-1720 (1998).

Fama et al., "High performance germanium-on-silicon detectors for optical communications," *Applied Physics Letters* 81(4): 586-588 (2002).

Fischetti et al., "Band structure, Deformation Potentials, and Carrier Mobility in Strained Si, Ge, and SiGe Alloys," *Journal of Applied Physics* 80:2234-2252 (1996).

Giovane et al., "Correlation between leakage current density and threading dislocation density in SiGe p-i-n diodes grown on relaxed graded buffer layers", *Applied Physics Letters* 78:541-543 (2001).

Hartmann et al., "Reduced pressure-chemical vapor deposition of Ge thick layers on Si(001) for 1.3-1.55-μm photodetection," *Journal of Applied Physics* 95:5905-5913 (2004).

Huang et al., "Fully Silicided NiSi and Germanided NiGe Dual Gates on $SiO_2$/Si and $Al_2O_3$/Ge-On-Insulator MOSFETs," IEDM: 319-322 (2003).

Hull, "Metastable strained layer configurations in the SiGe/Si system," (1999) *EMIS Datareviews, Series No. 24: Properties of SiGe and SiGe:C*, edited by Erich Kasper et al., INSPEC (2000), London, UK.

Ishikawa et al., "Strain-induced band gap shrinkage in Ge grown on Si substrate," *Applied Physics Letters* 82(12): 2044-2046 (2003).

Jackson et al., "Gate-Self-Aligned p-Channel Germanium MISFET's," *IEEE Electron Device Letters* 12(11):605-607 (1991).

Kasper, "Prospects of SiGe Heterodevices," *Journal of Crystal Growth* 150:921-925 (1995).

Kasper et al., "New virtual substrate concept for vertical MOS transistors," *Thin Solid Films* 336:319-322 (1998).

Lee et al., "Growth of Strained Si and Strained Ge Heterostructures on Relaxed $Si_{1-x}Ge_x$ by Ultrahigh Vacuum Chemical Vapor Deposition," *J. Vac. Sci. Technol.* B 22(1): 158-164 (2004).

Lee et al., "Strained Ge channel p-type metal-oxide-semiconductor field-effect transistors grown on $Si_{1-x}Ge_x$/Si virtual substrates," *Applied Physics Letters* 79:3344-3346 (2001).

Lee et al., "Strained Si/strained Ge Dual-channel Heterostructures on Relaxed $Si_{0.5}Ge_{0.5}$ for Symmetric Mobility *p*-type and *n*-type Metal-oxide-Semiconductor Field-effect Transistors," *Applied Physics Letters* 83(20): 4202-4204 (2003).

Lee et al., "Electron Mobility Characteristics of *n*-channel Metal-oxide-semiconductor field-effect Transistors Fabricated on Ge-rich Single- and Dual-channel SiGe Heterostructures," *Journal of Applied Physics* 95(3):1550-1555 (2004).

Letertre et al., "Germanium-on-insulator (GeOI) structure realized by the Smart Cut™ technology," *MRS Proceedings*, vol. 809 (2004).

Li et al., "Selective growth of Ge on Si(100) through vias of $SiO_2$ nanotemplate using solid source molecular beam epitaxy," *Applied Physics Letters* 83(24): 5032-5034 (2003).

Liu et al., "Silicidation—induced band gap shrinkage in Ge epitaxial films on Si," *Applied Physics Letters* 84(5): 660-662 (2004).

Luan et al., "High-quality Ge epilayers on Si with low threading-dislocation densities," *Applied Physics Letters* 75:2909-2911 (1999).

Lyutovich et al., "Interaction between point defects and dislocations in SiGe," *Solid State Phenomena* 69-70:179-184 (1999).

Lyutovich et al., "Relaxed SiGe buffer layer growth with point defect injection," *Materials Science and Engineering* B71:14-19 (2000).

Lyutovich et al., "Thin SiGe buffers with high Ge content for *n*-MOSFETs," *Materials Science and Engineering* B89:341-345 (2002).

Masini et al.; "High-Performance p-i-n Ge on Si Photodetectors for the Near Infrared: From Model to Demonstration," *IEEE Transactions of Electron Devices* 48(6): 1092-1096 (2001).

Ni et al., "X-ray reciprocal space mapping studies of strain relaxation in thin SiGe layers (≦100 nm) using a low temperature growth step," *Journal of Crystal Growth* 227-228:756-760 (2001).

Reinking et al., "Ge p-MOSFETs compatible with Si CMOS-technology," *Proceedings of the 29th ESSDERC* 99:300-303 (1999).

Samavedam et al., "High-quality germanium photodiodes integrated on silicon substrates using optimized relaxed graded buffers," *Applied Physics Letters* 73:2125-2127 (1998).

Schöllhorn et al., "Coalescence of germanium islands on silicon," *Thin Solid Films* 336:109-111 (1998).

Shang et al., "Electrical characterization of germanium *p*-channel MOSFETs," *IEEE Electron Device Letters* 24:242-244 (2003).

Thomas et al., "Structural characterization of thick, high-quality epitaxial Ge on Si substrates grown by low-energy plasma-enhanced chemical vapor deposition," *Journal of Electronic Materials* 32:976-980 (2003).

"Physics of Thin Films", printed from http://www.uccs.edu/~tchriste/courses/PHYS549/549lectures/film2.html (Feb. 22, 2000).

International Search Report for International Application No. PCT/US04/07564 dated Apr. 6, 2005.

The File Wrapper for U.S. Appl. No. 10/800,390, now U.S. Patent No. 7,238,595, filed Mar. 12, 2004, titled "Epitaxial Semiconductor Deposition Methods and Structures", listing as inventor Brabant et al.

Office Action for U.S. Appl. No. 10/800,390 now U.S. Pat. No. 7,238,595 dated Jun. 9, 2005.

Office Action for U.S. Appl. No. 10/800,390 now U.S. Pat. No. 7,238,595 dated Sep. 8, 2005.

Office Action for U.S. Appl. No. 10/800,390 now U.S. Pat. No. 7,238,595 dated Jan. 24, 2006.

Office Action for U.S. Appl. No. 10/800,390 now U.S. Pat. No. 7,238,595 dated Jul. 24, 2006.

U.S. Appl. No. 11/067,307, filed Feb. 25, 2005, titled "Germanium Deposition", listing as inventor Bauer et al.

Office Action for U.S. Appl. No. 11/067,307 dated Nov. 1, 2006.

Office Action for U.S. Appl. No. 11/067,307 dated Feb. 28, 2007.

* cited by examiner

DUAL CHANNEL HETEROSTRUCTURE

RELATED APPLICATION INFORMATION

This application is related to U.S. patent application Ser. No. 10/800,390, filed Mar. 12, 2004, now U.S. Patent Publication No. 2004/0219735, and U.S. patent application Ser. No. 11/067,307, filed Feb. 25, 2005, now U.S. Patent Publication No. 2005/0191826, the disclosures of which are incorporated herein by reference.

BACKGROUND OF THE INVENTION

1. Field of the Invention

This invention relates in general to strained semiconductor layers and methods for forming the same, and more particularly to stacked semiconductor layers forming dual channel heterostructures.

2. Description of the Related Art $Si_{1-x}Ge_x$ films are used in a wide variety of semiconductor applications. An issue that often arises during the production of these materials is the lattice strain that may result from heteroepitaxial deposition. A "heteroepitaxial" deposited layer is an epitaxial or single crystal film that has a different composition than the single crystal substrate onto which it is deposited. A deposited epitaxial layer is said to be "strained" when it is constrained to have a lattice structure in at least two dimensions that is the same as that of the underlying single crystal substrate, but different from its inherent lattice constant. Lattice strain occurs because the atoms in the deposited film depart from the positions that they would normally occupy in the lattice structure of the free-standing, bulk material when the film deposits in such a way that its lattice structure matches that of the underlying single crystal substrate. For example, heteroepitaxial deposition of a Ge-containing material such as SiGe or Ge itself onto a single crystal Si substrate generally produces compressive lattice strain because the lattice constant of the deposited Ge-containing material is larger than that of the Si substrate. The degree of strain is related to the thickness of the deposited layer and the degree of lattice mismatch between the deposited material and the underlying substrate.

Strain is in general a desirable attribute for active device layers, since it tends to increase the mobility of electrical carriers and thus increase device speed. In order to produce strained layers on conventional silicon structures, however, it is often helpful to create a strain relaxed, intermediate heteroepitaxial layer to serve as a template for a further strained layer that is to remain strained and serve as an active layer with increased carrier mobility. These intermediate films are often provided by a relaxed $Si_{1-x}Ge_x$ "buffer" layer over single crystal unstrained silicon (e.g., wafer surface), which can be engineered to provide the desired strain of an overlying layer (e.g., strained silicon layer).

Si forms a native oxide layer more readily than Ge, hence Si-over-Ge structures, where silicon is in contact with upper-level features, are preferred. One promising structure being investigated is the combination of a strained Si layer with a strained Ge layer. For example, Lee et al., "Strained Si/strained Ge dual-channel heterostructures on relaxed $Si_{0.5}Ge_{0.5}$ for symmetric mobility p-type and n-type metal-oxide-semiconductor field-effect transistors," *Applied Physics Letters*, Vol. 83, No. 20 (17 Nov. 2003), pp. 4202-04, the teachings of which are incorporated herein by reference, disclose structures with a mobility enhancement by a factor of 1.7-1.9 for electrons and 10-12 for "holes." The structure takes advantage of the enhanced hole mobility (particularly beneficial for PMOS transistors) in compressively strained Ge, when positioned below a pure Si layer. The overlying tensile strained Si demonstrates enhanced electron mobility, which is particularly beneficial for NMOS transistors. Advantageously, this common channel structure can be provided across both NMOS and PMOS transistors of a CMOS structure, such that dominant channel current is in the strained Ge layer for the PMOS and in the strained Si layer for the NMOS transistors. See also Lee et al., "Growth of strained Si and strained Ge heterostructures on relaxed $Si_{1-x}Ge_x$ by ultrahigh vacuum chemical vapor deposition," *J. Vac. Sci. Technol.*, Vol. B 22(1) (January/February 2004), pp. 158-164.

The process described by Lee et al. in the above-referenced articles first forms a relaxed $Si_{0.5}Ge_{0.5}$ layer, followed by a compressively strained Ge layer, followed by a tensile strained Si layer thereover. The primary challenge identified by Lee et al. in their work was the ability to deposit thin, planar layers in this system. Strained layers (including the $Si_{0.5}Ge_{0.5}$ layer prior to relaxation) have a tendency to relax via stress-driven surface diffusion, resulting in islanding or undulations. Deposition temperature, degree of lattice mismatch in the heteroepitaxy and material melting points tend to affect the morphology of the layers. The melting point of $Si_{1-x}Ge_x$ decreases with Ge content and the surface diffusivity of a material generally scales with its melting point. Accordingly, while low temperatures are still needed, compressive $Si_{1-x}Ge_x$ films are less susceptible to undulation than pure Ge films for a given temperature and strain.

Lee et al. were able to achieve decent planarity by employing ultra high vacuum CVD (UHVCVD) at 350° C. to deposit Ge (even 400° C. resulted in unacceptable undulations and roughness). Subsequently a Si cap layer had to be deposited in order to maintain planarity, and also to serve the dual function of a Si channel in a dual channel heterostructure. Lee et al. also needed to raise the deposition temperature in order to achieve any level of Si deposition using common hydrides as precursors. By employing disilane ($Si_2H_6$) rather than more common monosilane ($SiH_4$), Lee et al. were able to deposit at 450° C. (thus reducing incidence of undulations). However, a Si cap layer of only 3 nm thickness took 1.5 hours to grow at 450° C.

More efficient, commercially feasible methods are therefore desirable.

SUMMARY OF THE INVENTION

According to one aspect of the invention, methods are provided for forming a substrate comprising a dual-channel heterostructure. A $Si_{1-x}Ge_x$ ("SiGe") buffer layer, where x is a number between 0 and 1, is deposited over a substrate. A strained silicon (Si) layer is deposited over the SiGe buffer layer and a strained germanium-containing layer is deposited over the strained silicon layer. In preferred embodiments, the SiGe buffer layer is strain-relaxed.

In some embodiments, the substrate comprising the SiGe, strained silicon and strained germanium-containing layers is bonded to a host substrate, preferably comprising an insulating layer such as a layer of $SiO_2$. The carrier substrate and SiGe buffer layers are then removed, leaving the strained silicon layer over the strained germanium-containing layer over the host substrate. One or more CMOS devices can then be formed in the dual-heterostructure. In other embodiments, an SiGe film is formed over the strained germanium-containing layer, and the host substrate is bonded to the SiGe film.

In other aspects, methods are provided for forming a substrate comprising a dual-channel heterostructure. A SiGe buffer layer is provided over a first substrate. A strained silicon layer is provided over the SiGe buffer layer and a strained germanium-containing layer is provided over the strained silicon layer. A second substrate is provided over the strained germanium-containing layer. The first substrate and the strain-relaxed SiGe buffer layer are removed.

In yet other aspects, dual-channel heterostructures are provided comprising a layer of insulating material over a silicon substrate, a strained germanium-containing layer over the layer of insulating material and a layer of strained silicon over the strained germanium-containing layer. The heterostructure may comprise one or more CMOS devices.

In yet other aspects, intermediate dual-channel heterostructures are provided. The structures comprise an SiGe layer, a layer of strained silicon over the SiGe layer, and a strained germanium-containing layer over the layer of strained silicon. The SiGe layer is preferably strain-relaxed.

All of these embodiments are intended to be within the scope of the invention herein disclosed. These and other embodiments of the present invention will become readily apparent to those skilled in the art from the following detailed description of the preferred embodiments having reference to the attached figures, the invention not being limited to any particular preferred embodiment(s) disclosed.

BRIEF DESCRIPTION OF THE DRAWINGS

The appended drawings (not to scale) are meant to illustrate and not to limit the invention.

DETAILED DESCRIPTION OF THE PREFERRED EMBODIMENTS

Figure 1:
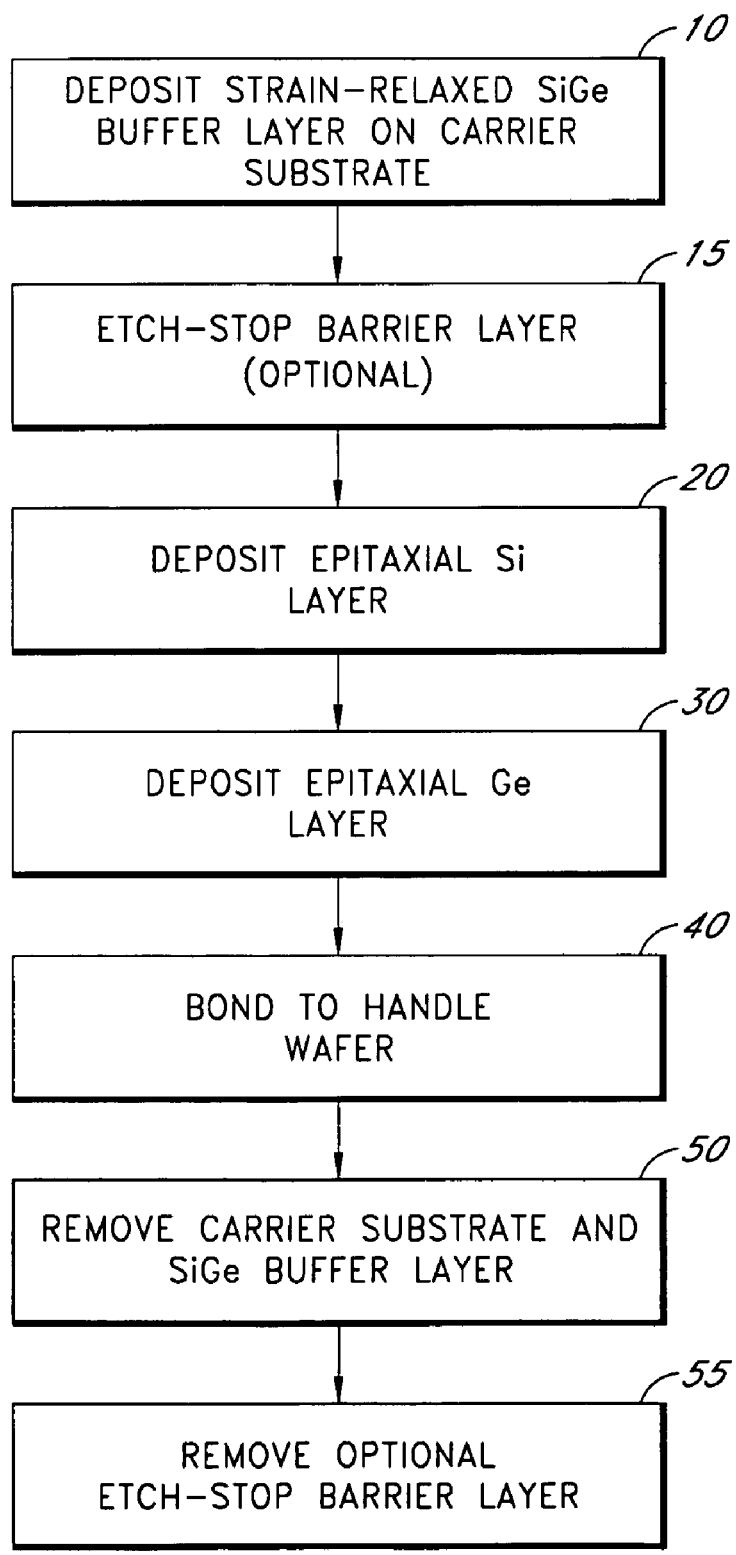
FIG. 1 shows a flow chart for a process for forming a dual channel heterostructure on insulator structure.

Dual channel heterostructures comprising multiple epitaxial strained semiconductor layers can be formed on a substrate. These heterostructures can further be used to prepare dual channel heterostructure-on-insulator substrates in which CMOS devices with enhanced electrical properties can be formed.

The strained semiconductor heterostructure preferably comprise both a strained Si and a strained Ge layer over a buffer. However, in contrast to Lee et al. (*J. Vac. Sci. Technol. B* 22(1) (January/February 2004), the disclosure of which is incorporated herein by reference), which describes deposition of a strained Si layer over a strained Ge layer, in the embodiments disclosed herein, a strained Si layer is deposited on a carrier substrate at a first temperature, and a strained Ge-containing layer is deposited on the strained Si layer preferably at a lower temperature. This avoids the problems (e.g., agglomeration of Ge into islands) Lee et al. encountered in keeping their strained Ge films smooth during subsequent deposition of the strained Si layer, while allowing for an adequate deposition rate. In preferred embodiments, the layers are subsequently inverted by transfer to a host substrate. However, in some embodiments, the heterostructure is used as deposited, for example, in a high-k gate structure.

In some embodiments, the strained germanium layer, also referred to herein as a "strained germanium-containing layer", is a strained silicon-germanium layer with a germanium concentration preferably between about 50% and 100%, more preferably greater than about 50%, even more preferably greater than about 70%, and most preferably greater than about 80%. As an example, the strained germanium-containing layer can have a silicon and germanium concentration of about 20% and about 80%, respectively. In other embodiments, the strained germanium-containing layer can have a germanium concentration of about 100%.

The heterostructure described herein is preferably used to form a heterostructure-on-insulator substrate. That is, a heterostructure comprising a strained Si layer under a strained Ge layer is formed on a first carrier substrate preferably comprising a strain relaxed buffer layer. The first substrate is then inverted over and bonded to a handle or host wafer, preferably comprising a layer of an insulating material, such as, e.g., $SiO_2$. The layer of insulating material preferably allows confinement of electronic wave-functions within the heterostructure. The underlying first substrate and buffer structure are removed, leaving a heterostructure-on-insulator structure. As a result of the transfer process the strained Ge and strained Si layers are inverted from their position as deposited and CMOS devices formed in the heterostructure-on-insulator substrate enjoy the advantages of a strained Ge lower channel, which provides highly enhanced hole or positive carrier mobility, and a strained Si upper channel, which provides highly enhanced electron or negative carrier mobility.

Briefly, as illustrated in the flow chart of FIG. 1, in the embodiments disclosed herein, a $Si_{1-x}Ge_x$ ("SiGe") buffer layer, where 'x' is a number from 0 to 1, is formed 10 over a single crystal silicon structure, such as on a bulk Si substrate or epitaxial layer. The SiGe buffer is preferably strain-relaxed. Optionally, a thin initial layer of epitaxial germanium can be deposited over the epitaxial Si layer prior to deposition of the SiGe buffer layer, as discussed in more detail below. In some embodiments, an optional etch-stop barrier layer may be deposited 15 on the strain-relaxed SiGe buffer layer. The optional etch-stop barrier layer may be formed of materials such as silicon oxide, silicon nitride and silicon oxynitride. An epitaxial silicon layer is then deposited 20 over the relaxed buffer layer. The epitaxial silicon layer preferably has a thickness less than the critical thickness under the deposition conditions, such that it is tensile strained. Finally, a compressively strained epitaxial germanium layer is deposited 30 over the strained silicon layer. In some embodiments, a further SiGe film is deposited on the strained epitaxial germanium layer.

The resulting layer stack can then be bonded 40 to a handle wafer, preferably one that has been oxidized or otherwise comprises a layer of insulating material. The original substrate comprising the original single crystal Si structure is then removed 50, along with at least a portion of the SiGe buffer layer (and initial epitaxial Ge layer, if present). In some embodiments, a bulk part (or a substantial portion) of the SiGe buffer layer is removed. The optional etch-stop barrier layer can be removed 55 using, e.g., a wet etch. The resulting heterostructure-on-insulator substrate comprises a layer of strained silicon and a layer of strained germanium overlying a layer of an insulator, such as $SiO_2$. Devices such as PMOS and NMOS devices can be formed in the structure.

Figure 2:
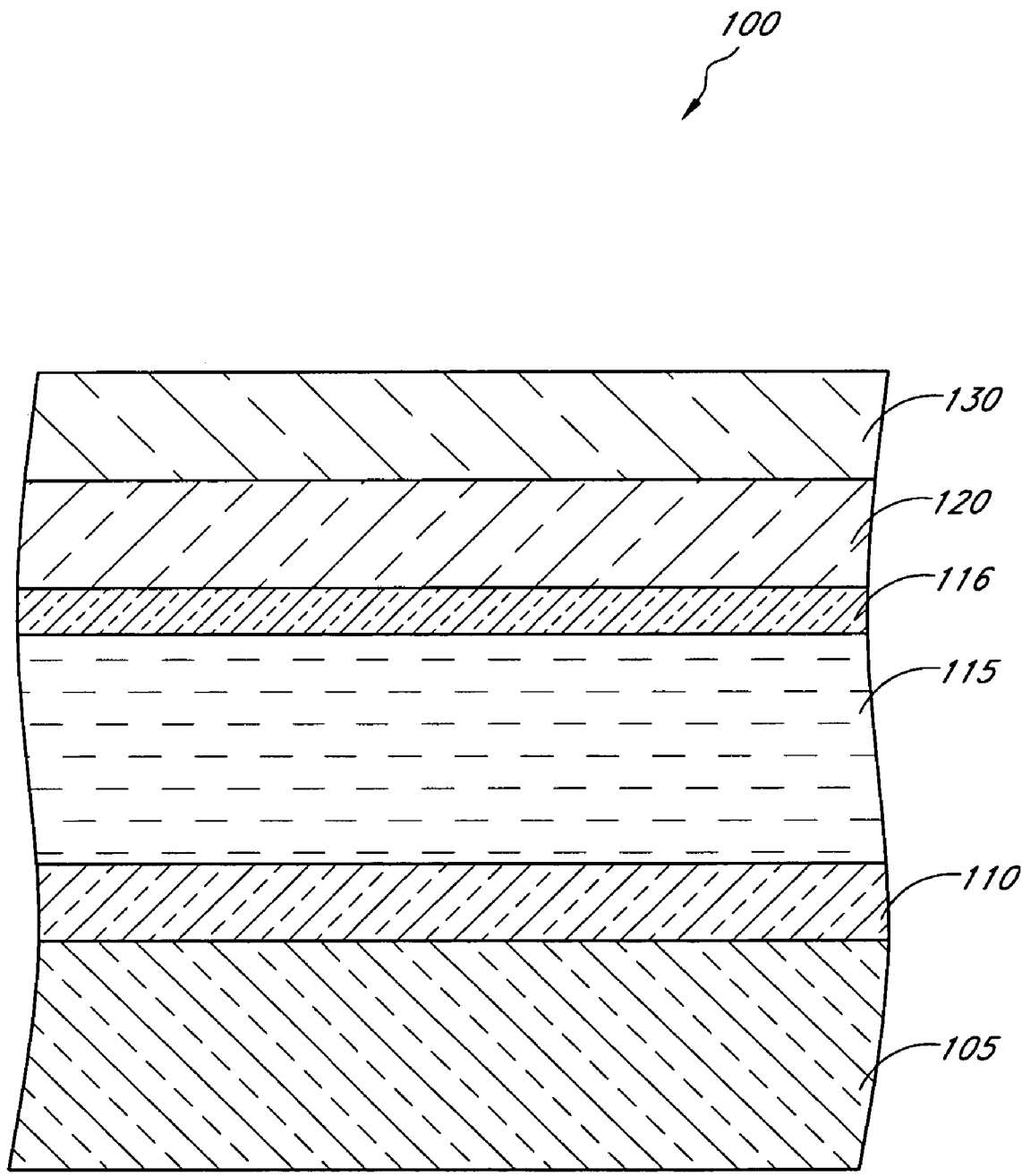
FIG. 2 shows a schematic cross sectional view of a preferred multilayer heterostructure as deposited.

FIG. 2 illustrates a semiconductor heterostructure 100 in accordance with some embodiments. The structure 100 comprises a single crystal Si structure 105 (e.g., an epitaxial Si layer or single crystal Si wafer surface); an optional thin epitaxial Ge-containing layer 110, preferably an epitaxial germanium layer, which overlies the single crystal Si structure 105, and a $Si_{1-x}Ge_x$ buffer layer 115 that has been deposited on the optional epitaxial Ge-containing layer 110, where x is in the range from zero to one. As discussed in more detail below, the $Si_{1-x}Ge_x$ layer 115 preferably comprises a lower Ge content than the Ge-containing layer 110 and may be graded or comprise a constant composition across its thickness. In some embodiments the SiGe layer 115 comprises between about 45 and 55%, more preferably about 50 atomic % germanium at an upper surface. A tensile-strained heteroepitaxial silicon (sSi) layer 120 is deposited over the $Si_{1-x}Ge_x$ buffer layer 110, and a compressively-strained heteroepitaxial germanium (sGe) layer 130 is deposited over the sSi layer 130. An optional etch-stop barrier layer 116 is deposited on the SiGe layer 115 prior to depositing the sSi layer 120. In some embodiments, an SiGe film (not shown) is deposited on the sGe layer 130.

The formation of each of the layers in the heterostructure (Ge, SiGe, sSi and sGe) can be by any method known in the art. However, several preferred methods are described below. In addition, substrates comprising a strain-relaxed, SiGe buffer layer are available commercially. Thus, in some embodiments, formation of the heterostructure begins with deposition of a strained silicon layer on such a substrate.

Those skilled in the art will understand that terms such as "silicon," "silicon-germanium," "Si," and "SiGe," are terms of art used to show that the material comprises the indicated elements, and are not to be construed as limiting the relative proportions of those elements nor as excluding the presence of other elements. For example, a "SiGe" film may contain Si and Ge in various proportions and may contain other elements as well, e.g., electrically active dopants such as boron and gallium for p-type semiconductors and antimony, arsenic and phosphorous for n-type semiconductors. Thus, the terms "SiGe" and "$Si_{1-x}Ge_x$" are used equivalently. Those skilled in the art will understand that single crystal (or mono-crystal) Ge (e.g., epitaxial Ge) is highly pure (>99.9% Ge) and that single crystal Si (e.g., epitaxial Si) is also highly pure (>99.9% Si), and that both may be undoped or doped with electrically active dopants. In some embodiments this site film comprise $Si_{0.5}Ge_{0.5}$ film, at least at the surface, or discusses in more detail below.

Deposition of each of the heterostructure layers is preferably carried out in situ in the same reactor. In some embodiments a single wafer chemical vapor deposition (CVD) reactor is used. The reactor is available commercially under the trade name Epsilon® from ASM America, Inc. of Phoenix, Ariz. In other embodiments, a batch furnace is used. Batch furnaces typically have an elongated process chamber that is generally in the shape of a tube and is surrounded by heating elements. Semiconductor wafers are generally loaded into the furnace with the wafer faces oriented perpendicular to the elongate axis of the tube. Inside the furnace, the wafers are spaced apart, with limited spacing between the wafers to allow for gas diffusion between and contact with the wafers. Typically, process gases are supplied to the interior of the furnace from one end of the furnace. In some arrangements, the gases flow in a direction parallel to the elongate axis and are exhausted from a furnace end opposite to the end from which they entered. Process gases enter the space between adjacent wafers by diffusion. In this way, a large number of wafers (typically 50-100 wafers) can be processed simultaneously, making processing using these batch furnaces an efficient and economical production method. Suitable batch furnaces are commercially available, and preferred models include the Advance® 400 and Advance® 412 Series batch furnaces commercially available from ASM International N.V. of Bilthoven, the Netherlands. Other appropriate reactors will be apparent to the skilled artisan.

Routine experimentation can be used to determine the appropriate deposition conditions (e.g., deposition temperature and deposition pressure) for any particular layer of the heterostructure. As discussed below, deposition temperatures are typically in the range of about 250° C. to about 600° C., depending on the nature of the germanium and silicon precursors used and the particular deposition method. For example, lower deposition temperatures tend to be more appropriate as the thermal stability of the precursor decreases.

The total pressure in the reaction chamber is typically in the range of about $10^{-5}$ Torr to about 800 Torr. In the case of a single wafer CVD chamber, the pressure is preferably in the range of about 200 mTorr to about 760 Torr, even more preferably about 1 Torr to about 200 Torr, most preferably in the range of about 1 Torr to about 60 Torr.

Formation of SiGe Buffer Layer

A buffer structure comprising a $Si_{1-x}Ge_x$ buffer layer, in which 0<x<1 is deposited over an underlying unstrained single-crystal Si structure, such as a substrate comprising an epitaxial silicon layer. In some embodiments, the SiGe buffer layer is formed over a thin initial epitaxial germanium layer, as illustrated in FIG. 1. In other embodiments the initial epitaxial germanium layer is omitted. The SiGe buffer layer may be at a constant composition or may be graded layer.

The SiGe layer may be strained initially, e.g., because it has a larger lattice constant than Si but the actual crystal is forced to align with the underlying unstrained single crystal Si structure. Ultimately, the SiGe layer is relaxed, such as by heating or deposition beyond the critical thickness, so that it adopts its natural lattice constant, which is higher than the underlying unstrained epitaxial Si. An overlying epitaxial Si layer that is deposited on the strain-relaxed SiGe layer will be tensile strained because it is forced to align with the larger lattice constant of the relaxed SiGe buffer layer. In turn, an epitaxial Ge layer deposited over the strained Si layer will be compressively strained because it is forced to align with the smaller lattice constant of the strained Si, which is approximately the same as the lattice constant of the relaxed SiGe buffer layer. Thus, use of the relaxed SiGe buffer layer provides a way to produce both overlying strained epitaxial Si and Ge layers. In some preferred embodiments, $Si_{0.5}Ge_{0.5}$ induces equal strain in both Si and Ge, although in other embodiments it may be preferable to induce more strain in one (Si or Ge) than the other.

The SiGe buffer layer may be deposited by any method known in the art. Preferably, deposition is by a chemical vapor deposition (CVD) type process. Well known methods exist for such heteroepitaxial deposition methods, ranging from batch, furnace-based low pressure CVD (LPCVD) to single-wafer, cold-wall chamber based rapid thermal chemical vapor deposition (RTCVD) processes. In some embodiments, SiGe deposition is conducted at very low pressures by Ultra High Vacuum Chemical Vapor Deposition (UHVCVD) or Molecular Beam Epitaxy (MBE).

In preferred embodiments, a SiGe film is deposited on a substrate from a germanium precursor and a silicon precursor by chemical vapor deposition (CVD). The CVD may take place in a single wafer, cold wall, single pass laminar flow reactor such as the Epsilon™ CVD reactor available from ASM America. Routine experimentation can be used to determine the deposition conditions (e.g., deposition temperature and deposition pressure) for any particular $Si_{1-x}Ge_x$ layer.

The deposition process may employ any silicon precursors, germanium precursors and carrier gases and may be performed under a variety of temperatures, pressures and flow rates. Preferred silicon precursors include, without limitation, silane ($SiH_4$), disilane ($Si_2H_6$), trisilane ($Si_3H_8$), dichlorosilane ($SiH_2Cl_2$), trichlorosilane ($SiH_3Cl$), and tetrachlorosilane. Germanium precursors include, without limitation, $GeCl_4$, $GeH_4$, digermane, $(CH_3)GeCl_3$ and $(H_9C_4)GeH_3$. Alternatively, SiGe buffer layers with varying Si and Ge ratios may be formed using one or more silicon and germanium-containing precursors (or single-source hydrides) with a general formula $Si_wH_xGe_yH_z$, wherein 'w' and 'y' are integers ranging from 0 to 4, and 'x' and 'z' are integers ranging from 0 and 12. Single-source hydrides include, without limitation, $SiH_3GeH_3$, $(H_3Ge)_2SiH_2$, $(H_3Ge)_3SiH$, $(H_3Ge)_4Si$. Other silicon and germanium precursors that may be used will be apparent to one of skill in the art in view of the disclosure herein. The optimal precursors and reaction conditions, including flow rate, deposition temperature and pressure, can be readily determined by the skilled artisan for a particular application without undue experimentation. The relative amounts of germanium and silicon precursor may be held constant during the deposition, or varied to provide graded layers.

In some embodiments, a carrier gas, such as $H_2$, is flowed through the chamber continuously during the deposition process, for example at a flow rate of about 20 slm. In one preferred embodiment the concentration of germanium precursor, such as $GeH_4$, is about 10% in the main carrier gas.

The skilled artisan can select the appropriate deposition temperature to ensure the optimum deposition rate. In some embodiments the temperature is constant throughout the deposition process. Preferably the temperature is between about 350° C. and about 1150° C. For example, in some embodiments the SiGe buffer layer is deposited from dichlorosilane (DCS) and germanium tetrachloride and the temperature is held constant at about 1050° C. throughout the deposition process. In other embodiments the SiGe buffer layer is deposited from DCS and germane and the temperature is held constant at about 900° C. In still other embodiments, the SiGe buffer layer is deposited from a single-source hydride (e.g., $SiH_3GeH_3$) initially at a temperature between about 450° C. and 460° C., followed by deposition at a temperature between about 800° C. and 1100° C.

In still other embodiments, the temperature is varied (or changed) during the deposition process, for example to produce a graded layer or to ensure the optimum deposition rate. For example, the temperature may be varied, either increasing or decreasing, over the course of the deposition. In particular embodiments a decreasing temperature profile is utilized. For example, during deposition of a SiGe buffer from germane and dichlorosilane (DCS), the temperature may be changed from about 900° C. to about 700° C., more preferably from about 900° C. to about 800° C. Again, using the disclosure herein, the skilled artisan can select the appropriate temperature(s) (and temperature profiles) for a particular application with routine experimentation.

The pressure in the reaction chamber during deposition can be readily determined by the skilled artisan based on the particular circumstances. In some embodiments the pressure is atmospheric pressure. In other embodiments a reduced pressure process is used, with a pressure of between about 1 and 100 torr, more preferably between about 20 and 80 torr. In still other embodiments, such as when ultra high vacuum CVD is employed, the pressure is preferably below about 1 torr.

Although the SiGe buffer layer may comprise a constant composition, it can be graded. In some embodiments it is graded from a lower Ge content at the lower interface with the substrate to a higher Ge content at the upper interface with the overlying Si layer. The buffer layer may be linearly graded across its thickness. However, in other embodiments the gradation profile is not linear. For example, in some embodiments a graded layer may comprise one or more regions of constant composition.

Although discussed herein primarily in terms of varying the flow of the germanium, silicon, and/or germanium and silicon-containing precursors into the reaction chamber and/or varying deposition temperature, one of skill in the art will recognize that grading of the SiGe layer can be accomplished by any method known in the art, including, without limitation, adjusting the deposition temperature, adjusting the deposition pressure, adjusting relative precursor flows, or by a combination of the three. For example, for a high Ge content, low temperatures are preferably used to avoid islanding, and high pressure (e.g., 100 Torr) may be employed. Where lower Ge content is desired, for some reactant combinations (e.g., DCS and $GeH_4$), temperature is preferably increased and pressure decreased (to, e.g., 20 Torr) during the deposition to grade the SiGe composition. In preferred embodiments, the relative concentrations of Si and Ge in the buffer layer are controlled by varying the flow of the germanium and silicon precursors. In still other embodiments, one or more single-source hydrides selected from the group consisting of $SiH_3GeH_3$, $(H_3Ge)_2SiH_2$, $(H_3Ge)_3SiH$ and $(H_3Ge)_4Si$, may be used. These advantageously enable formation of SiGe films of varying compositions without the need of introducing separate silicon and germanium precursors. $SiH_3GeH_3$, $(H_3Ge)_2SiH_2$, $(H_3Ge)_3SiH$ and $(H_3Ge)_4Si$ typically yield SiGe films with compositions $Si_{0.5}Ge_{0.5}$, $Si_{0.33}Ge_{0.67}$, $Si_{0.25}Ge_{0.75}$ and $Si_{0.20}Ge_{0.80}$, respectively. It will be appreciated that a plurality of single-source hydrides (e.g., $SiH_3GeH_3$ and $(H_3Ge)_4Si$) may be used to form SiGe buffer layers with compositions in-between those achievable with only one single-source hydride.

In some embodiments, at the substrate/SiGe interface the SiGe layer preferably comprises between about 0% and about 10% Ge, more preferably less than or equal to about 5% Ge, yet more preferably less than or equal to about 2% Ge. In one embodiment the SiGe film comprises about 1% Ge at the substrate/SiGe interface. While the Ge concentration at the substrate/SiGe interface is typically less than about 10%, higher concentrations are possible. In other embodiments, at the substrate/SiGe interface, the Ge concentration preferably can be greater than about 50%, more preferably greater than about 80%, and most preferably about 100%.

The Ge concentration at the surface of the SiGe buffer is preferably higher than the Ge concentration at the substrate/SiGe interface, and may be as high as 50% or more. In one embodiment the SiGe film comprises between about 10% and about 80% Ge at the surface, more preferably between about 45% to about 55%. The grading profile may be selected to minimize defect formation. As discussed above, in some embodiments the grading profile will reflect a SiGe layer with a linear change in the concentration of Ge, while in other embodiments the grading profile will reflect a SiGe layer comprising one or more regions with a graded Ge concentration and one or more regions with a constant composition.

One of skill in the art will be able to optimize the gradation profile, and hence the composition of the buffer layer, without undue experimentation.

In other embodiments the entire SiGe layer has a constant composition. In one such embodiment, the SiGe buffer layer comprises about 50% silicon and about 50% germanium (i.e., $Si_{0.5}Ge_{0.5}$). In such a case, the SiGe layer may be formed using $SiH_3GeH_3$, which advantageously enables formation of a compositionally uniform $Si_{0.5}Ge_{0.5}$ layer without the need of separately controlling the flow rates of individual silicon and germanium precursors.

The thickness of the SiGe layer that is deposited over the Si substrate will be at least partly based on the concentration of germanium in the layer. Higher concentrations of Ge correlate with SiGe layers that fully relax at lower thicknesses and at lower temperatures. Since relaxed SiGe layers with a high Ge concentration but a low defect density are desirable, the SiGe layer may be gently graded to minimize defects. However, it will be appreciated that other methods may be used to minimize defects, such as the use of pinning layers or super lattice structures.

Frequently, the Si-containing substrate is heated during a preceding process step to a much higher temperature than that used for the subsequent deposition of the SiGe layer, so that there is a cooling period between the two steps. For example, the substrate may be heated during deposition of an epitaxial Si layer on the substrate. High temperatures may also be used to prepare a substrate already comprising an epitaxial Si layer for epitaxial SiGe deposition. For example, the substrate may be cleaned by baking at about 450° C. or higher, typically 750° C. or higher, often 1150° C., to sublime native oxides and/or drive off surface contaminants.

Following heating, the substrate is typically cooled to a second temperature during a cooling period. The second temperature may be any temperature that is lower than the first temperature, and is preferably in a range that is appropriate for heteroepitaxial deposition of the buffer structure. Since Ge-containing films deposited at high temperatures generally have a high degree of surface roughness, the single crystal Si substrate is desirably cooled to a temperature of less than 600° C., more preferably about 450° C. or less prior to SiGe deposition. In a preferred embodiment, a substrate comprising an epitaxial silicon surface is cooled to a temperature in the range of about 300° to 500°, more preferably about 380° C. to about 480° C. prior to SiGe deposition. In some embodiments, a SiGe seed layer, preferably with a thickness of about 3-4 monolayers (ML), is deposited at this temperature prior to continued deposition of the SiGe buffer layer at a higher temperature.

After cooling of the substrate (if required), and optional deposition of a like seed layer, further deposition of a buffer structure is initiated at a first temperature, preferably between about 380° C. and about 480° C., more preferably at about 450° C. Deposition may be continued at this temperature, or the deposition temperature may then be increased in order to increase the deposition rate and decrease defect density as-deposited.

In some embodiments, a three-step SiGe deposition process is utilized. In a first bulk deposition step, deposition is begun at a first temperature. In a second bulk deposition step, the temperature is ramped up to a higher temperature while continuing deposition. In a third bulk deposition step, deposition is continued at the higher temperature or at another temperature greater than the first temperature.

For example, in one embodiment during a first stage, a silicon precursor and a germanium precursor are introduced to the reaction chamber at a temperature between about 380° C. and about 480° C., more preferably at about 450° C., to produce an initial smooth continuous layer of epitaxial SiGe. This may be the seed layer mentioned above. The initial epitaxial SiGe layer is then preferably heated to about 650° C.-1150° C. during a second stage in which both precursors are provided to the reaction space. The precursor flow is continued at the higher temperature to deposit an additional amount of SiGe at an increased deposition rate onto the initial layer during a bulk deposition stage. The amounts of Si precursor and Ge precursor may be adjusted to produce a graded SiGe layer, if desired. In an alternative embodiment, one or more single-source hydrides, such as, e.g., $SiH_3GeH_3$, $(H_3Ge)_2SiH_2$, $(H_3Ge)_3SiH$ and $(H_3Ge)_4Si$, may be used. The one or more single-source hydrides are preferably introduced into the reaction chamber at a temperature between about 380° C. and about 480° C., more preferably between about 450° C. and 460° C.

Preferably, during the temperature ramp the temperature is increased at a rate of between approximately 100° C. min$^{-1}$ and approximately 500° C. min$^{-1}$, more preferably at about 300° C. min$^{-1}$. Additionally, n-type dopants (e.g., $AsH_3$ or $PH_3$) may be introduced into the reaction chamber during the temperature ramp. N-type dopants may improve the surface quality of the deposited SiGe layer.

During the cooling period, it is desirable for the surface of the Si-containing substrate to be kept free from contamination, such as contamination with oxygen or carbon. To minimize surface contamination the cleaned Si substrate is generally maintained under vacuum or in the same constantly purged chamber during cooling. However, such systems are still subject to small amounts of contamination.

In one embodiment of the instant invention, the Si-containing substrate surface is protected from contamination during cooling by contacting the Si-containing surface (e.g., epitaxial Si) with a surface active compound, preferably a Si or Ge source chemical, during a least part of the time that the surface is cooling. The term "surface active compound" refers to a chemical compound that protects a single crystal Si-containing surface from contamination without interfering with the epitaxial or heteroepitaxial deposition of the subsequent layer. The surface active compound is most preferably a Si compound.

It has been found that such surface active compounds decrease or prevent contamination and thus improve the quality of subsequently deposited Ge-containing materials (e.g., epitaxial Ge and SiGe). Preferably, the surface active compound undergoes little or no thermal decomposition under the conditions and during the time that the Si-containing surface is cooling, so that deposition on the Si-containing surface during that time is minimized or avoided. Furthermore, the surface active compound is selected to not condense on the Si-containing surface during cooling. Depending on the cooling conditions, preferred surface active compounds for this purpose include silanes (e.g., silane, disilane, and trisilane), halosilanes (e.g., chlorosilane, dichlorosilane, trichlorosilane, and tetrachlorosilane), alkylsilanes (e.g., methylsilane and dimethylsilane), germanes (e.g., germane, digermane), halogermanes (e.g., tetrachlorogermane) and single source hydrides (e.g., $SiH_3GeH_3$). It will be understood that mixtures of two or more surface active compounds can also be employed in some circumstances. In a particular embodiment, dichlorosilane (DCS) is used as the surface active compound. In other embodiments, trichlorosilane is used. In still other embodiments, $SiH_3GeH_3$ is used.

Si compounds are in general preferred over Ge compounds for the surface active compound because deposition during cooling will be minimized and any deposited silicon will have a reduced tendency (compared to Ge) to agglomeration during the cooling from high temperatures, although use of certain halogermanes (e.g., chlorogermanes) as the surface active compound advantageously will exhibit minimal germanium deposition during the cool down.

The contacting of the surface active compound with the Si-containing substrate during the cooling period is preferably carried out by flowing or diffusing the surface active compound across the surface of the substrate. Routine experimentation may be used to select a flow rate that supplies an amount of surface active compound to the surface that is effective to reduce or avoid contamination during cooling.

After cooling to the second temperature, the buffer structure is formed. In some embodiments this comprises depositing the epitaxial SiGe layer. In other embodiments, an epitaxial Ge layer is deposited, followed by the epitaxial SiGe buffer layer, as discussed in more detail below. The silicon and germanium precursors can be the same as or different from the surface active compound discussed above.

The relaxation of epitaxial SiGe layers often presents problems. For example, the relaxation of SiGe layers typically produces various crystal defects (e.g., misfit dislocations and threading dislocations), since relaxation represents a transition in crystal structure from the smaller lattice constant of the underlying templating Si structure. Misfit dislocations form as part of the process of relaxation. The presence of threading dislocations in the SiGe, however, particularly near the upper SiGe surface, may introduce corresponding defects into an epitaxial Si layer that is deposited onto the SiGe layer. It has been found that the density of threading dislocations (as opposed to desirable misfit dislocations or dislocation loops) can be reduced by using a thick graded SiGe buffer layer. As is known in the art, such thick graded SiGe buffer layers typically start with a high Si content and gradually introduce greater amounts of Ge as deposition proceeds until the desired proportion of Ge is left at the upper surface to set the crystal mismatch for an overlying strained layer. The critical thickness is thus higher than with a uniform composition at the target concentration, and when relaxation does occur, the threading dislocations tend to have a reduced density. But such thick layers increase deposition time.

Thinner $Si_{1-x}Ge_x$ (preferably SiGe) buffer layers may be used by placing a thin epitaxial germanium layer with high Ge content (e.g., about 40 at. % or higher, more preferably 50 at. % or higher, still more preferably about 80 at. % or higher, yet more preferably about 90 at. % or higher) between the underlying unstrained epitaxial Si layer and the $Si_{1-x}Ge_x$ buffer layer. Thus, in some embodiments a buffer structure comprises an epitaxial germanium layer underneath a SiGe layer.

The thickness of the thin epitaxial germanium layer may be varied, depending on the defect density and thickness that can be tolerated in the overlying $Si_{1-x}Ge_x$ layer, but is preferably in the range of from about 10 Å to 1 µm, more preferably about 10 Å to about 500 Å, and most preferably about 15 Å to about 300 Å.

The thin epitaxial germanium layer can be deposited as described herein for deposition of the SiGe layer, as described below for deposition of a strained germanium layer, or by other methods known in the art. For example, in some embodiments a thin epitaxial Ge layer is deposited at a low temperature, preferably less than about 450° C., more preferably less than about 350° C. In some embodiments, deposition at the low temperature is followed by temperature ramping to a higher temperature (e.g., approximately 600-800° C.) while continuing to flow the germanium precursor.

The pressure in the reaction chamber during deposition of the thin Ge layer is typically between about 0.2 torr and about 850 torr, more preferably between about 1 torr and about 760 torr. The thin Ge layer preferably has a thickness between about one atomic monolayer and about 1000 Å, more preferably from about 3 Å to about 600 Å. The germanium source may be, for example, digermane, trigermane or a chlorinated germanium source. Optimal reaction conditions, including temperature, pressure, flow rate and reactant, can be determined by the skilled artisan without undue experimentation. Generally, lower temperatures are more appropriate for germanium precursors with lower thermal stability.

Generally, the higher the Ge content of the epitaxial germanium layer, the greater the benefit, such that a "pure" epitaxial Ge layer (with or without electrical doping) is most preferred. Such pure Ge has a very low critical thickness, which in combination with the ability to deposit thin, smooth continuous Ge films with minimal dislocation density, as described elsewhere herein, allows a very thin Ge film that relaxes naturally upon deposition.

The overlying SiGe portion of the buffer structure can then be graded to reduce Ge content until the desired proportion of Ge is left at the upper surface to set the crystal mismatch for an overlying strained layer. The $Si_{1-x}Ge_x$ layer preferably has a lower dislocation density than would a comparable $Si_{1-x}Ge_x$ layer deposited directly onto the underlying single crystal Si structure.

The described buffer structure can be described as "retrograde," since the Ge concentration is inverted relative to conventional graded SiGe buffers. Grading can be more abrupt than with a conventional SiGe buffer, since the high Ge content of the Ge-containing layer at the underlying Si/Ge interface allows dislocations to glide out more readily, such that the overall buffer thickness can be reduced without higher dislocation densities.

As will be understood by the skilled artisan in view of the present disclosure, by starting with a high Ge content, dislocations generated by the lattice mismatch between the buffer structure (Ge layer and SiGe layer) and the underlying single crystal Si are largely taken up in the initial high Ge content (e.g., pure Ge) layer and more readily glide out of the layer. This benefit is obtained even without a separate anneal step, though annealing can also be performed.

The multilayer structure 100 illustrated in FIG. 2 (including the optional, thin epitaxial germanium layer 110) may be formed by depositing an epitaxial germanium layer 110 onto a single crystal Si substrate 105, preferably after cooling the Si substrate in contact with a surface active compound. It will be understood, however, that the use of a surface active compound and the epitaxial Ge layer 110 are optional and that the benefits of the heterostructures and sequences for forming the heterostructures, as described herein, can be obtained without utilizing the surface active compound during cooling and/or without the epitaxial Ge layer 110.

In some embodiments, an etchant may be provided to the reaction chamber during deposition of the thin Ge epitaxial layer and/or during deposition of the SiGe layer. Additionally, in some embodiments a purge gas is flowed in the reaction space. For example, hydrogen gas may be supplied to the reactor at high flow rates (e.g., about 5 slm or greater) with pressures in the range of 10-100 torr. The purge gas may reduce contamination of the substrate. Further details on particular process conditions are disclosed in U.S. patent application Ser. No. 11/067,307, filed Feb. 25, 2005 (attorney docket no. ASMEX.481A), now U.S. Patent Publication No. 2005/0191826, the disclosure of which is incorporated herein by reference in its entirety.

In some embodiments, the buffer structure is annealed in situ to drive out defects and smooth the compositional gradient. For example, the buffer structure can be held at an elevated temperature (preferably less than 1150° C. for $Si_{0.5}Si_{0.5}$) for a period of time, such as about 900° C. for about 5 minutes. The optional anneal can also be, for example, a spike anneal. In one embodiment temperature is ramped up from the deposition temperature until a peak temperature of about 800° C. to 1200° C., more preferably 900° C. to about 1150° C. is reached. The anneal can be continued at the highest temperature for a period of time. However, even without any plateau annealing, such a spike anneal can be sufficient to drive out defects, particularly in embodiments in which the buffer structure comprises a high Ge content at the lower interface. In other embodiments, the temperature is cycled, such that the substrate is heated and cooled repeatedly for a predetermined time.

Preferably deposition of the SiGe layer 115 leaves a top surface with a Ge content between about 40% and 80%, more preferably about 45% to 60%. In one arrangement, the Ge concentration at the top of the SiGe layer 115 is about 50%. Advantageously, 50% Ge enables deposition of strained Si 120 and about equally strained Ge 130 over the SiGe layer 115.

At 50% Ge concentration, the lattice constant of the relaxed SiGe layer 115 is symmetrically larger and smaller than the lattice constant of pure Si and pure Ge, respectively. Thus, both a strained Si 120 and a strained Ge 130 layer can be formed over the buffer, as described in more detail below.

Epitaxial Strained Silicon Deposition

Following deposition of a buffer structure comprising a strain relaxed SiGe layer 115, a layer of tensile strained epitaxial silicon 120 is deposited. The Si layer 120 may be deposited by any method known in the art. Preferably the strained Si layer 120 is deposited by CVD in the same reaction chamber as the SiGe buffer layer 115. In order to maintain the tensile strain, the thickness of the Si layer 120 is maintained below the critical thickness.

Briefly, a substrate comprising a strain relaxed buffer structure 115 over single crystal silicon 105 is heated or cooled to the desired deposition temperature, preferably from about 300° C. to about 800° C., more preferably from about 450° C. to about 700° C. The substrate is then contacted with a silicon precursor, such as silane, disilane, trisilane or dichlorosilane (DCS) until a Si layer of the desired thickness has been formed. The skilled artisan will appreciate that other silicon precursors can be utilized and will be able to select the appropriate reaction conditions based on the particular circumstances without undue experimentation.

In one embodiment silicon deposition is conducted at a constant temperature. For example, in a preferred embodiment a strained silicon layer is deposited at a temperature of between about 500° C. and about 700° C. using trisilane or other silicon precursors.

In other embodiments deposition is begun at a higher temperature, for example at about 600° C., and ramped down when the critical thickness is approached. This temperature ramp process provides good crystal quality and growth rate while maintaining a high deposition rate. Preferably, the temperature is ramped down from about 600° C. to a temperature between about 450° C. and 500° C. as the critical thickness is approached. Preferably the temperature is decreased at a controlled rate to provide film thickness uniformity.

Any other methods known the art may be used to deposit the strained silicon layer 120. Preferably silicon deposition is conducted in situ with the deposition of the strained relaxed buffer structure 115.

Epitaxial Strained Germanium Deposition

One of the problems described by others in preparing dual channel heterostructures is the inability to produce thin, smooth compressive strained Ge films. Ge deposition techniques have been found difficult, even with UHVCVD techniques. The Ge deposition techniques described herein and in U.S. patent application Ser. No. 10/800,390, now U.S. Patent Publication No. 2004/0219735, incorporated herein by reference in its entirety, have been found to produce films of excellent quality under commercially viable conditions, including pressures above 200 mtorr.

In preferred embodiments, after formation of a strained silicon layer 120 (FIG. 2), the substrate is cooled (if necessary) to the Ge deposition temperature. The substrate is preferably cooled to a temperature of less than about 600° C., and more preferably less than about 450° C. before germanium deposition commences. In an exemplary embodiment, the substrate is cooled from the silicon deposition temperature to the desired germanium deposition temperature at between approximately 1° C. sec$^{-1}$ and approximately 10° C. sec$^{-1}$. More preferably, the substrate is cooled from the first temperature to the second temperature at a rate of approximately 4° C. sec$^{-1}$.

A surface active compound (preferably a Si or Ge precursor) is optionally provided during at least part of the cool down (e.g., from 600-800° C. down to the Ge deposition temperature), generally as described above with respect to cooling prior to forming the Ge layer 110. A strained epitaxial Ge layer 130 is then deposited, preferably in situ with deposition of the strain relaxed buffer layer 115 and/or the strained Si layer 120.

The epitaxial Ge layer 130 may be deposited by any method known in the art. Preferably, it is deposited over the strained Si layer 120 by a CVD process comprising introducing a germanium source chemical to the reactor. In some embodiments, the Ge layer is deposited at a temperature from about 350° C. to about 450° C. from a Ge precursor, e.g., germane or digermane, to a thickness less than its critical thickness. In some embodiments, deposition is started at about 450° C., followed by a gradual ramp down in temperature to a temperature between about 380° C. to about 450° C. as the critical thickness is approached. Preferably, the temperature change is carried out at between approximately 1° C. sec$^{-1}$ and approximately 10° C. sec$^{-1}$. In a particular embodiment, the epitaxial germanium layer is deposited at a temperature of about 350° C. and a pressure preferably between about 1 Torr and 760 Torr, more preferably between about 10 Torr and 200 Torr, by introducing germane to the reactor at a flow rate of about 20 sccm or greater (e.g., 200 sccm). Those skilled in the art will understand that other germanium sources (e.g., digermane, trigermane, chlorinated germanium sources) may be used in place of germane, with appropriate adjustment of reaction conditions, including flow rate, deposition temperature and pressure, as can be readily determined by routine experimentation. Deposition may be continued until an epitaxial Ge layer 130 of predetermined (and/or desired) thickness is formed.

In some embodiments, deposition is continued to form an optional SiGe layer (or film) (not shown) over the epitaxial Ge layer 130. The optional SiGe film may be helpful in confining electronic wave functions within the heterostructure. The SiGe film may be formed generally as described above, for example, by introducing a silicon source together with the germanium source used to grow layer 130, or as an alternative, by terminating the flow of the germanium source and introducing a single-source hydride (e.g., $SiH_3GeH_3$). The SiGe film may be deposited at a temperature between about 380° C. and 480° C., more preferably between about 450° C. and 460° C. If $Si_{0.5}Ge_{0.5}$ is desired, the SiGe film can have any thickness. For other ratios (e.g., $Si_{0.2}Ge_{0.8}$), the deposition temperature is preferably decreased as the critical thickness of the SiGe film is approached to ensure good crystal quality. For example, deposition may be started at about 450° C., followed by a gradual ramp down in temperature to a temperature between about 380° C. to about 450° C. as the critical thickness is approached. Preferably, the temperature change is carried out at between approximately 1° C. sec$^{-1}$ and approximately 10° C. sec$^{-1}$. The source flow is typically continued during the temperature ramp. The ultimate thickness of the SiGe layer is preferably less than the critical thickness, such that the layer remains strained.

The pressure in the reaction chamber during Ge deposition is preferably between approximately 0.200 torr and approximately 850 torr. More preferably, the pressure in the reaction chamber during the seed deposition operation is between approximately 1 torr and 760 torr. Most preferably, the pressure in the reaction chamber during the seed deposition operation is between approximately 10 torr and 760 torr.

To improve smoothness of the germanium film, an etchant is optionally provided to the reaction chamber during deposition. In one embodiment, the etchant is hydrochloric acid. By planarizing the film surface, the "gliding" of threading dislocations is facilitated, thereby allowing a germanium film having a reduced etch pit density to be produced.

Exemplary Deposition Process

Figure 3:
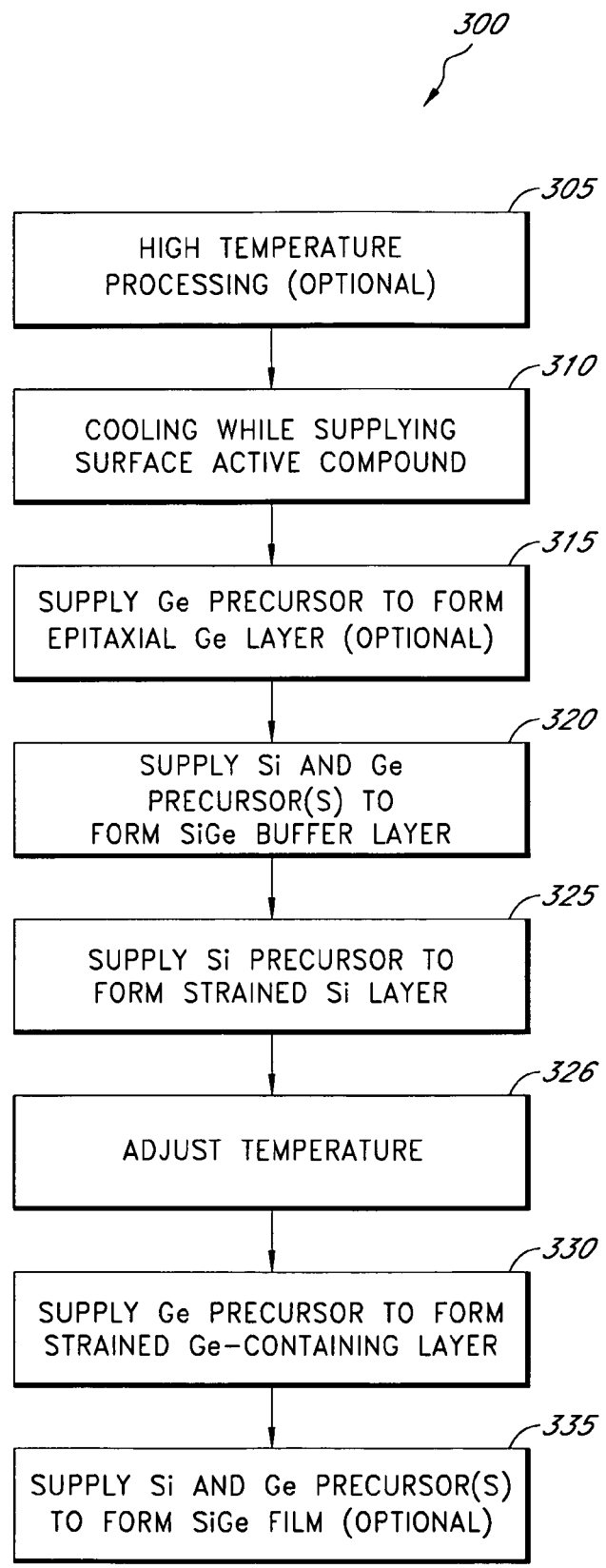
FIG. 3 shows a flow chart for a process of forming a dual channel heterostructure comprising strained silicon and strained germanium layers.

With reference to FIG. 3, an exemplary deposition sequence 300 is provided. Following optional high temperature processing 305 (e.g., hydrogen bake or using a silicon precursor to deposit a Si-containing layer) a surface active compound is supplied 310 to prevent contamination of the surface of the epitaxial Si-containing layer during a cooling period. In some embodiments, a germanium precursor is then supplied 315 to form a thin epitaxial germanium layer. However, as discussed above, this step is optional and is omitted in embodiments in which a SiGe buffer layer is deposited directly over the epitaxial silicon layer. Silicon and germanium precursors (or a single-source hydride, see above) are supplied 320 to deposit a SiGe layer. The SiGe layer is strain relaxed, for example as a result of deposition beyond its critical thickness or as a result of subsequent processing.

The temperature is adjusted to a temperature appropriate for Si deposition, preferably from about 300° C. to about 800° C., more preferably from about 500° C. to about 700° C. A Si precursor, such as, e.g., silane, trisilane, or DCS, is supplied 325 to deposit a Si layer. The Si layer is preferably deposited to a thickness less than its critical thickness, such that it remains strained. The temperature may then be adjusted 326 to an appropriate Ge deposition temperature, preferably from about 300° C. to about 600° C., more preferably from about 350° C. to about 450° C. A germanium precursor, preferably germane or digermane, is then provided 330 (preferably immediately after the silicon precursor supply is terminated) to deposit a strained Ge layer. The process 300 will be described in more detail with respect to a particular embodiment below. In some embodiments, an SiGe film is deposited 335 on the strained Ge layer by, e.g., continuing the supply of Ge precursor from the previous step (330) and introducing a silicon precursor, or by introducing a single-source hydride (e.g., $SiH_3GeH_3$). In some embodiments, the SiGe film is strain-relaxed.

In the first step 305 a silicon precursor is used to deposit an epitaxial Si layer. In the illustrated embodiment, an epitaxial silicon layer is deposited onto a substrate by first heating the substrate to a first deposition temperature of about 600° C., then contacting the substrate with a silicon precursor until the desired thickness of epitaxial silicon has been deposited. In an alternative embodiment (not illustrated), the Si-containing layer is formed outside the deposition system, e.g., the substrate already comprises a single crystal Si surface layer. In this alternative embodiment, the first high temperature step 305 comprises only a bake step that is used to clean the single crystal Si surface. In other embodiments an epitaxial silicon layer is not deposited and the deposition process begins with the third step 315 or deposition of the grated layer 325.

In the second step 310, substrate is cooled to a second temperature from about 350° C. to about 400° C., while concurrently contacting the single crystal Si structure with a surface active compound (such as, e.g., dichlorosilane or trichlorosilane). In an alternative embodiment, the flow of the surface active compound is initiated before cooling begins, e.g., near the end of the first step 305.

In the third step 315, an epitaxial germanium layer is deposited onto the single crystal Si by contacting the epitaxial Si layer with a germanium precursor, such as germane, at a temperature between about 300° C. to about 500° C., more preferably between about 350° C. to about 450° C. A strain-relaxed SiGe layer (abrupt or graded) is deposited 320 by concurrently contacting the epitaxial germanium layer with a germanium precursor and a silicon precursor, such as germane and silane at a temperature between about 350° C. and about 1150° C. As an alternative, the strain-relaxed SiGe layer may be deposited by contacting the epitaxial germanium layer with a single-source hydride, such as, e.g., ($SiH_3GeH_3$). During deposition 320 of the strain-relaxed SiGe layer, the temperature may be ramped up from a lower first temperature (or the temperature used to deposit the optional epitaxial Ge layer) to an elevated second temperature, both preferably between about 350° C. and 1150° C.

A strained Si layer is then deposited 325 over the SiGe layer by contacting the substrate with a silicon precursor, such as silane at a temperature between about 300° C. to about 800° C., more preferably between about 500° C. to about 700° C. The temperature is then adjusted 326 to an appropriate germanium deposition temperature, which may include cooling the substrate to a temperature at or below 500° C. As illustrated, the temperature may be adjusted 326 following deposition 325 of the strained Si layer. However, in some cases the temperature may be adjusted 326 during deposition 325 of the strained Si layer (e.g., near the completion of the deposition of strained Si layer, the temperature may be gradually decreased to an appropriate germanium deposition temperature). Next, a strained germanium layer is deposited 330 over the strained silicon layer at a temperature between about 300° C. to about 500° C., more preferably between about 350° C. to about 450° C. Preferably, the strained germanium-containing layer is deposited 330 by simultaneously decreasing or terminating the flow of silicon precursor and initiating the flow of germanium precursor. In some embodiments, the flow of silicon precursor is terminated and the flow of germanium precursor is initiated after a predetermined period of time. In other embodiments, the flow of silicon precursor is adjusted to form a germanium-rich (e.g., about 80% germanium) strained germanium-containing layer.

Production of Heterostructure-On-Insulator Substrate

Figure 5:
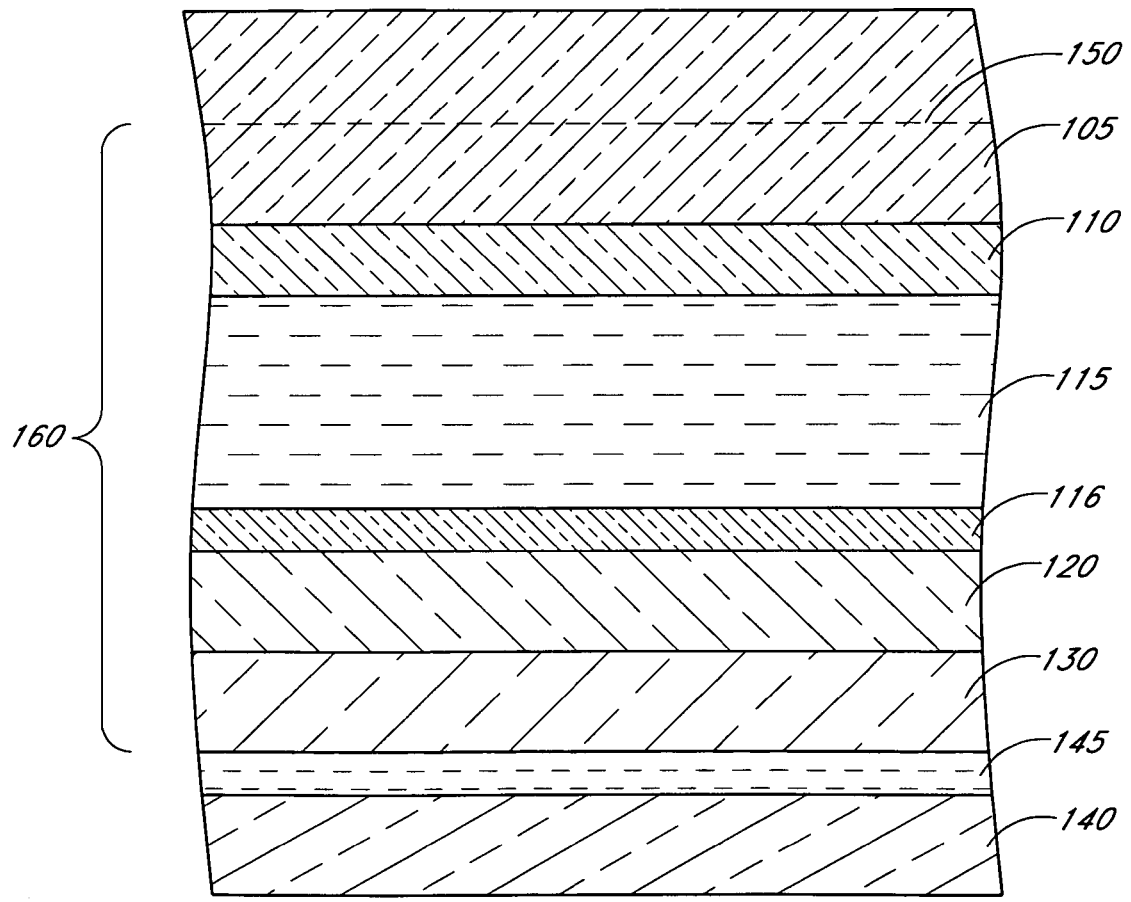
FIG. 5 shows an inverted schematic cross sectional view of the structure of FIG. 4 with a specific line.

After the structure illustrated in FIG. 2 is formed, a layer transfer technique can be used to transfer the strained silicon and strained germanium layers from the substrate on which they have been deposited (the carrier substrate, typically a bulk substrate) to a host substrate comprising an insulating layer in order to produce a dual channel heterostructure on insulator structure. In some embodiments the host structure does not include an insulating layer. As mentioned above, in the process of transferring the layers, they are inverted from the order in which they were deposited and that is illustrated in FIG. 5. Thus, the resulting heterostructure on insulator substrate will comprise a layer of strained silicon 120 overlying a layer of strained germanium 130, which in turn overlies an insulator 145, such as silicon oxide. In some embodiments, the layer of strained germanium 130 overlies an SiGe film (not shown), which in turn overlies the insulator 145. Subsequent processing steps are then conducted to form active devices utilizing the dual channel heterostructure. An etch-stop barrier layer 116 may be provided between the layer of strained silicon 120 and the SiGe buffer layer 115 to protect the layer of strained silicon 120 during a subsequent removal step (see below).

The layer transfer may be accomplished by any method known in the art, including ion implantation and other methods to define a separation layer (e.g., forming a buried selectively etchable layer. In a preferred embodiment layer transfer is performed using the commercially available SMART-CU™ technology (SOITEC, France). In an exemplary embodiment, hydrogen ions are implanted at an appropriate level within the substrate, wherein the implantation depth is determined by adjusting the implantation energy. Implantation of hydrogen ions weakens the structure of the silicon substrate, thereby allowing the heterostructure layers to be separated from the carrier substrate. The hydrogen ions may be implanted before or after depositing the SiGe buffer layer, the strained Si layer and the strained Ge layer, depending on the thermal budgets and tolerance for migration of implanted hydrogen. A variety of different techniques can be used to separate the carrier substrate from the heterostructure layers along the separation line.

Figure 4:
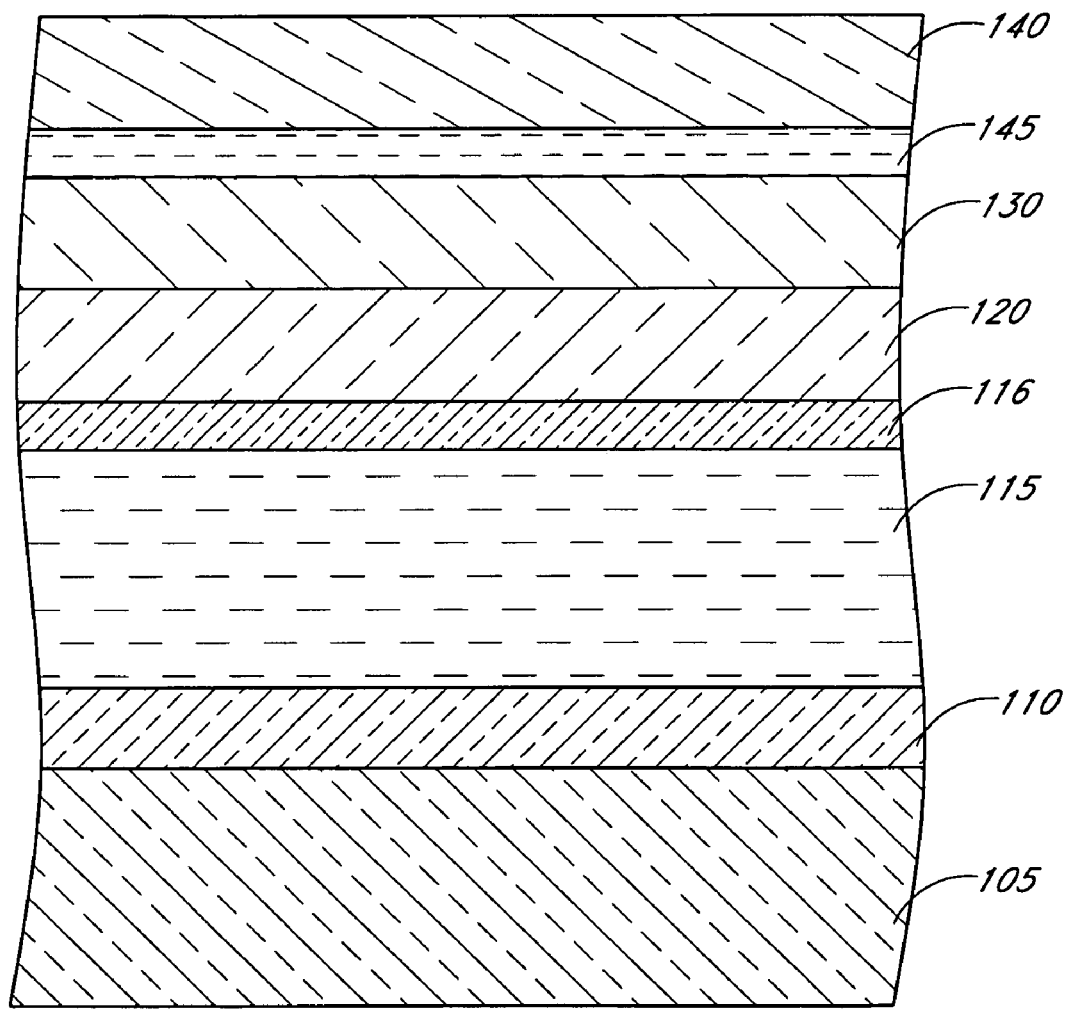
FIG. 4 shows a schematic cross sectional view of a dual channel heterostructure formed on a carrier substrate and bound to a handle wafer.

In one embodiment, the layer transfer technique comprises inverting the structure illustrated in FIG. 2 and bonding the upper strained germanium layer 130 to a host substrate 140 comprising an insulator layer 145 to produce the structure illustrated in FIG. 4. The carrier substrate 105 is then separated from the host substrate 140 along a separation line 150 (FIG. 5, dotted line). The structure is illustrated in FIG. 5, which shows the transferred layers 160 inverted and positioned over the silicon host substrate 140. After separation, the remaining SiGe buffer layer 115 is removed, for example by etching or polishing (e.g., touch polishing), leaving the dual channel heterostructure illustrated in FIG. 6. In one embodiment the SiGe buffer layer and any remaining portions of the original carrier substrate are removed by wet etching. In another embodiment, the SiGe buffer layer 115 is removed by chemical mechanical polishing (CMP). In such a case, the etch stop barrier layer 116 prevents polishing of the sSi layer 120. After removal of the SiGe buffer layer 115, an etching chemistry can be provided to remove the etch stop barrier layer 116.

Figure 6:
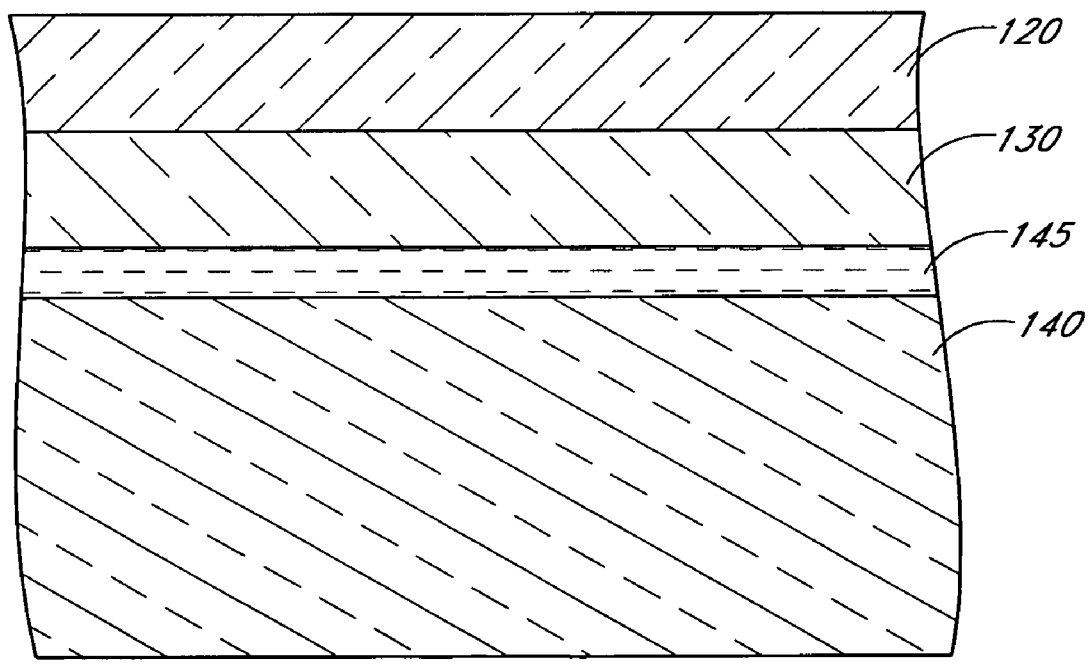
FIG. 6 shows a schematic cross sectional view of the structure of FIG. 4 after removing the carrier substrate and buffer layer.

Once the structure illustrated in FIG. 6 is formed, individual transistor devices and other features are formed in further processing steps.

Preferred embodiments of the present invention advantageously permit formation of smooth, thin and relatively defect-free Si, Ge and SiGe layers. Formation of the strained Ge layer following formation of the strained Si layer reduces (or even eliminates) Ge agglomeration, providing a heterostructure with reduced defect densities. By inverting the heterostructure via transferring to a host substrate, a dual channel heterostructure with a preferred orientation (i.e., from bottom to top, insulator, sGe, sSi) can be achieved. Structures of preferred embodiments permit a CMOS device to have a low threshold current, or the current below which a transistor shuts off, and above which the transistor turns on. This advantageously reduces power consumption and, as an example, permits longer battery life in mobile electronics.

It will be appreciated by those skilled in the art that various omissions, additions and modifications may be made to the processes described above without departing from the scope of the invention, and all such modifications and changes are intended to fall within the scope of the invention, as defined by the appended claims.

I claim:

1. A method for producing a dual-channel heterostructure, the method comprising:
   depositing a $Si_{1-x}Ge_x$ buffer layer, where x is a number between 0 and 1, on a carrier substrate comprising a single-crystal silicon structure;
   depositing a strained silicon layer over the $Si_{1-x}Ge_x$ buffer layer;
   depositing a compressively strained germanium-containing layer over the strained silicon layer;
   providing a host substrate over the compressively strained germanium-containing layer; and
   removing the carrier substrate and the $Si_{1-x}Ge_x$ buffer layer.

2. The method of claim 1, wherein the carrier substrate is a bulk silicon substrate.

3. The method of claim 1, wherein the $Si_{1-x}Ge_x$ buffer layer is strain-relaxed.

4. The method of claim 1, wherein the single crystal silicon structure comprises an epitaxial silicon layer deposited on the carrier substrate.

5. The method of claim 1, further comprising forming an epitaxial germanium layer on the carrier substrate prior to depositing the $Si_{1-x}Ge_x$ buffer layer.

6. The method of claim 5, wherein the $Si_{1-x}Ge_x$ buffer layer is graded such that the concentration of germanium decreases from an interface with the epitaxial germanium layer to an interface with the strained silicon layer.

7. The method of claim 1, wherein the strained silicon layer is tensile strained.

8. The method of claim 1, wherein removing comprises chemical mechanical polishing (CMP).

9. The method of claim 1, further comprising forming an etch-stop barrier layer on the $Si_{1-x}Ge_x$ buffer layer.

10. The method of claim 1, wherein the $Si_{1-x}Ge_x$ buffer layer comprises $Si_{0.5}Ge_{0.5}$.

11. The method of claim 10, wherein $Si_{0.5}Ge_{0.5}$ is deposited using $SiH_3GeH_3$ as a precursor.

12. The method of claim 1, wherein the $Si_{1-x}Ge_x$ buffer layer is graded.

13. The method of claim 1, wherein a surface of the host substrate comprises an insulator.

14. The method of claim 13, wherein the surface of the host substrate is disposed between the host substrate and the compressively strained germanium-containing layer.

15. The method of claim 13, wherein the insulator is $SiO_2$.

16. The method of claim 1, wherein at least one of the $Si_{1-x}Ge_x$ buffer layer, the strained silicon layer and the compressively strained germanium-containing layer is deposited by CVD.

17. The method of claim 1, wherein the $Si_{1-x}Ge_x$ buffer layer, the strained silicon layer and the compressively strained germanium-containing layer are deposited in situ.

18. The method of claim 1, additionally comprising forming one or more CMOS devices in the dual-channel heterostructure.

19. The method of claim 1, wherein providing a host substrate comprises bonding the host substrate to the compressively strained germanium-containing layer.

20. The method of claim 1, further comprising depositing a $Si_{1-x}Ge_x$ film, where x is a number between 0 and 1, over the compressively strained germanium-containing layer prior to providing the host substrate over the strained germanium-containing layer.

21. The method of claim 20, wherein providing a host substrate comprises bonding the host substrate to the $Si_{1-x}Ge_x$ film.

* * * * *

UNITED STATES PATENT AND TRADEMARK OFFICE
CERTIFICATE OF CORRECTION

PATENT NO.      : 7,648,853 B2                          Page 1 of 1
APPLICATION NO. : 11/485047
DATED           : January 19, 2010
INVENTOR(S)     : Matthias Bauer It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 439 days.

Signed and Sealed this

Twenty-third Day of November, 2010

David J. Kappos
*Director of the United States Patent and Trademark Office*